US012767872B2

(12) United States Patent
Zheng et al.

(10) Patent No.: US 12,767,872 B2
(45) Date of Patent: *Oct. 20, 2026

(54) THERMALLY CONDUCTIVE SILICONE COMPOSITION

(71) Applicant: Dow Silicones Corporation, Midland, MI (US)

(72) Inventors: Yan Zheng, Shanghai (CN); Dorab Bhagwagar, Saginaw, MI (US); Qianqing Ge, Shanghai (CN); Peng Wei, Shanghai (CN); Han Guang Wu, Shanghai (CN)

(73) Assignee: DOW SILICONES CORPORATION, Midland, MI (US)

( * ) Notice: Subject to any disclaimer, the term of this patent is extended or adjusted under 35 U.S.C. 154(b) by 388 days.

This patent is subject to a terminal disclaimer.

(21) Appl. No.: 18/566,121

(22) PCT Filed: Aug. 19, 2021

(86) PCT No.: PCT/CN2021/113465

§ 371 (c)(1),
(2) Date: Dec. 1, 2023

(87) PCT Pub. No.: WO2023/019504

PCT Pub. Date: Feb. 23, 2023

(65) Prior Publication Data

US 2024/0279525 A1 Aug. 22, 2024

(51) Int. Cl.

| | |
|---|---|
| ***C09K 5/14*** | (2006.01) |
| ***C08G 77/12*** | (2006.01) |
| ***C08G 77/20*** | (2006.01) |
| ***C08K 3/22*** | (2006.01) |
| ***C08K 3/28*** | (2006.01) |
| ***C08K 7/18*** | (2006.01) |
| ***C08K 9/08*** | (2006.01) |
| ***C08K 13/06*** | (2006.01) |
| ***H05K 7/20*** | (2006.01) |

(52) U.S. Cl.

CPC ................ *C09K 5/14* (2013.01); *C08G 77/12* (2013.01); *C08G 77/20* (2013.01); *C08K 13/06* (2013.01); *H05K 7/2039* (2013.01); *C08K 2003/2296* (2013.01); *C08K 2003/282* (2013.01); *C08K 7/18* (2013.01); *C08K 9/08* (2013.01); *C08K 2201/001* (2013.01); *C08K 2201/005* (2013.01)

(58) Field of Classification Search

CPC .......... C09K 5/14; C08G 77/12; C08G 77/20; C08K 13/06; C08K 7/18; C08K 9/08; C08K 2003/2296; C08K 2003/282; C08K 2201/001; C08K 2201/005; C08K 2003/2227; C08K 2003/385; C08K 3/38; C08K 3/28; C08K 3/22; C08K 5/5419; H05K 7/2039; C09D 183/04; C09J 183/04; C08L 83/04

See application file for complete search history.

(56) References Cited

U.S. PATENT DOCUMENTS

| | | | |
|---|---|---|---|
| 3,159,601 A | 12/1964 | Ashby et al. | |
| 3,220,972 A | 11/1965 | Lamoreaux | |
| 5,883,215 A | 3/1999 | Bischoff et al. | |
| 11,248,154 B2 | 2/2022 | Ishihara et al. | |
| 2006/0100336 A1 | 5/2006 | Fukui | |
| 2018/0134938 A1 | 5/2018 | Hirakawa et al. | |
| 2019/0292349 A1 * | 9/2019 | Ito | C09K 5/10 |
| 2021/0147681 A1 | 5/2021 | Hirakawa et al. | |

* cited by examiner

*Primary Examiner* — Andrew J. Oyer

(74) *Attorney, Agent, or Firm* — CANTOR COLBURN LLP

(57) ABSTRACT

A composition contains: (A) a curable silicone composition including: (a1) a vinyldimethylsiloxy-terminated polydimethylpolysiloxane having a viscosity in a range of 30-400 milliPascal*seconds, (a2) a silicon-hydride functional crosslinker, and (a3) a hydrosilylation catalyst, where the molar ratio of silicon-hydride functionality from the crosslinker to vinyl functionality is in a range of 0.5:1 to 1:1; (B) a filler treating agent comprising one or both of an alkyl trialkoxysilane and a mono-trialkoxysiloxy terminated dimethylpolysiloxane; and (C) a thermally conductive filler mixture including (c1) 40-55 wt % of aluminum nitride fillers, containing a blend of: (c1-a) 15-41 wt % of spherical aluminum nitride particles having a D50 particle size of 100 micrometers or more, and (c1-b) spherical or irregular shaped aluminum nitride particles having a D50 particle size of 20-80 micrometers; (c2) spherical aluminum oxide particles having a D50 particle size of 1-5 micrometers; and (c3) 10-20 wt % of irregular zinc oxide particles having a D50 particle size of 0.1-0.5 micrometer; where the total amount of the thermally conductive filler mixture is 94-97 wt %; and where wt % values are relative to the weight of the thermally conductive composition unless otherwise stated.

11 Claims, No Drawings

THERMALLY CONDUCTIVE SILICONE COMPOSITION

FIELD

The present invention relates to a thermally conductive silicone composition that contains aluminum nitride fillers.

INTRODUCTION

An industry drive to smaller and more powerful electronic devices has increased demands on thermally conductive materials useful for dissipating heat generated in such devices. For instance, the telecommunications industry is going through a generational shift to 5G networks, which demand highly integrated electrical devices with smaller sizes and that brings a requirement for double the power requirements (1200 Watts from 600 Watts). The heat generated by the high power in the smaller devices would damage the device if not efficiently dissipated. Thermally conductive interface materials are often used in electronics to thermally couple heat generating components and heat dissipating components. In order to efficiently transfer heat between coupled components, the thermally conductive composition desirably has a thermal conductivity of at least 9.0 Watts per meter*Kelvin (W/m*K) as measured according to ASTM method D5470-06. At the same time, as electronic devices become smaller it becomes more important to accurately and precisely apply the thermally conductive composition to the appropriate components during a rapid production process. In that regard, it is desirable for the thermally conductive material to have an extrusion rate (ER) of greater than 60 grams per minute (g/min) as measured at a pressure of 0.62 MegaPascals (90 pounds per square inch) with a standard 30 cubic centimeter EFD syringe package using the procedure described herein below.

Simultaneously achieving such a thermal conductivity and extrusion rate in a thermally conductive material is challenging. Increasing the amount of thermally conductive filler can increase the thermal conductivity, but also increases the viscosity, which inhibits the extrusion rate and thus impairs dispensing performance and usability. For example, conventional thermally conductive compositions containing aluminum nitride fillers with an ER of greater than 60 g/min typically cannot achieve a thermal conductivity of 9.0 W/m*K. Further addition of boron nitride that is a highly thermally conductive filler at concentrations of 5 weight-percent or more may increase the thermal conductivity to 9.0 W/m*K or more, but the resulting thermally conductive composition has a viscosity too high to achieve an ER of greater than 60 g/min or even becomes a powdery paste.

There remains a need to identify a thermally conductive composition that can simultaneously achieve an ER of greater than 60 g/min and a thermal conductivity of at least 9.0 W/m*K.

SUMMARY

The present invention provides a thermally conductive composition that simultaneously achieves an extrusion rate of greater than 60 g/min and a thermal conductivity of at least 9.0 W/m*K. Moreover, the thermally conductive composition is reactive and can cure into a cured thermally conductive material. The present invention comprises a novel combination of a curable organopolysiloxane, a filler treating agent, and a specific thermally conductive filler mixture. The thermally conductive filler mixture comprises a particular blend of aluminum nitride fillers with specific particle sizes and/or shape, spherical aluminum oxide particles having a D50 particle size of 1 to 5 micrometers (μm), and irregular shaped zinc oxide particles having a D50 particle size of 0.1 to 0.5 μm. The thermally conductive composition is useful, for example, as a thermally conductive interface material between components of electronic devices.

In a first aspect, the present invention is a thermally conductive composition comprising:

(A) a curable silicone composition comprising:

(a1) a vinyldimethylsiloxy-terminated polydimethylpolysiloxane having a viscosity in a range of 30 to 400 milliPascal*seconds, (a2) a silicon-hydride functional crosslinker, and (a3) a hydrosilylation catalyst, where the molar ratio of silicon-hydride functionality from the crosslinker to vinyl functionality is in a range of 0.5:1 to 1:1;

(B) a filler treating agent comprising one or both of an alkyl trialkoxysilane and a mono-trialkoxysiloxy terminated dimethylpolysiloxane; and (C) a thermally conductive filler mixture comprising, based on the weight of the thermally conductive composition, (c1) from 40 weight-percent to 55 weight-percent of aluminum nitride fillers, comprising a blend of:

(c1-a) from 15 weight-percent to 41 weight-percent of spherical aluminum nitride particles having a D50 particle size of 100 micrometers or more, and (c1-b) spherical or irregular shaped aluminum nitride particles having a D50 particle size of from 20 to 80 micrometers;

(c2) spherical aluminum oxide particles having a D50 particle size of from 1 to 5 micrometers; and (c3) from 10 weight-percent to 20 weight-percent of irregular shaped zinc oxide particles having a D50 particle size of from 0.1 to 0.5 micrometer;

where the total amount of the thermally conductive filler mixture is from 94 weight-percent to 97 weight-percent, based on the weight of the thermally conductive composition. The weight-percent values are relative to the weight of the thermally conductive composition unless otherwise stated.

In a second aspect, the present invention is an article comprising the thermally conductive composition of the first aspect on another material.

DETAILED DESCRIPTION

Test methods refer to the most recent test method as of the priority date of this document when a date is not indicated with the test method number. References to test methods contain both a reference to the testing society and the test method number. The following test method abbreviations and identifiers apply herein: ASTM refers to ASTM International methods; ISO refers to International Organization for Standards.

Products identified by their tradename refer to the compositions available under those tradenames on the priority date of this document.

"And/or" means "and, or as an alternative". All ranges include endpoints unless otherwise indicated. Unless otherwise stated, all weight-percent (wt %) values are relative to composition weight and all volume-percent (vol %) values are relative to composition volume.

"Viscosity" for a polysiloxane is determined by ASTM D445-21 using a glass capillary Cannon-Fenske type viscometer at 25 degrees Celsius (° C.) unless otherwise stated.

Determine chemical structure for polysiloxanes by standard $^{1}H$, $^{3}C$ and $^{29}Si$ nuclear magnetic resonance (NMR) analysis.

Determine average particle size for filler particles as the volume median particle size (D50) by using laser diffraction particle size analyzers (CILAS920 Particle Size Analyzer or Beckman Coulter LS 13 320 SW). "D" represents the diameter of filler particles, and D50 is the size in micrometers (μm) that splits the volume distribution with half the volume of filler particles above and half the volume of filler particles below this diameter. For example, if D50=5 μm, it means 50% of volume of particles are smaller than 5 μm.

Unless otherwise stated, all thermal conductivity values are determined according to ASTM D5470-06 using LonGwin Model LW 9389 TIM thermal resistance and conductivity measurement apparatus (also denoted as "TC-LonGwin").

The thermally conductive composition of the present invention comprises a curable silicone composition that itself comprises (a1) a vinyldimethylsiloxy-terminated polydimethylpolysiloxane (PDMS), (a2) a silicon-hydride (SiH) functional crosslinker and (a3) a hydrosilylation catalyst. The relative concentration of vinyldimethylsiloxy-terminated PDMS and SiH functional crosslinker is such that the molar ratio of SiH functionality from the crosslinker to vinyl functionality is in a range of 0.5:1 to 1:1, and can be 0.5:1 or more, 0.6:1 or more, 0.7:1 or more, 0.8:1 or more, even 0.9:1 or more while at the same time is 1:1 or less, and can be 0.9:1 or less, 0.8:1 or less, 0.7:1 or less, or even 0.6:1 or less.

The vinyldimethylsiloxy-terminated PDMS (a1) useful in the present invention has a viscosity of 30 milliPascal*seconds (mPa*s) or more, 45 mPa*s or more, 60 mPa*s or more, 90 mPa*s or more, 100 mPa*s or more, 120 mPa*s or more, 140 mPa*s or more, 160 mPa*s or more, even 180 mPa*s or more, while at the same time has a viscosity of 400 mPa*s or less, 300 mPa*s or less, 200 mPa*s or less, 180 mPa*s or less, 160 mPa*s or less, 140 mPa*s or less, 120 mPa*s or less, 100 mPa*s or less, 80 mPa*s or less, or even 60 mPa*s or less. If the viscosity is too high, then the thermally conductive composition will have too high of a viscosity to achieve the desired extrusion rate. If the viscosity is too low, then the thermally conductive composition risks having silicone migration or bleed issues and mechanical properties after cure that will be poor and prone to crumbling.

The vinyldimethylsiloxy-terminated PDMS useful in the present invention may have the following chemical structure (I):

$$Vi(CH_3)_2SiO—[(CH_3)_2SiO]_n—Si(CH_3)_2Vi \quad (I)$$

where: "Vi" refers to a vinyl group (—CH═$CH_2$) and n refers to the average number of dimethylsiloxane units, which is the degree of polymerization (DP) for the vinyldimethylsiloxy-terminated PDMS. Select n so as to achieve the desired viscosity for the vinyldimethylsiloxy-terminated PDMS. Typically, n is a value of 25 or more, and can be 30 or more, 35 or more, 40 or more, 45 or more, 50 or more, 60 or more, 70 or more, 80 or more, even 90 or more while at the same time is typically 200 or less, 190 or less, 180 or less, 170 or less, 160 or less, 150 or less, 140 or less, 130 or less, 120 or less, 100 or less, 90 or less, 80 or less, 70 or less, 60 or less, or even 50 or less.

Desirably, the vinyldimethylsiloxy-terminated PDMS comprises from 0.4 wt % to 2.4 wt % of vinyl functionality (i.e., vinyl groups), and can be 0.4 wt % or more, 0.5 wt % or more, 0.6 wt % or more, 0.7 wt % or more, 0.8 wt % or more, 0.9 wt % or more, 1.0 wt % or more, 1.1 wt % or more, 1.2 wt % or more, even 1.25 wt % or more, while as the same time is generally 2.4 wt % or less, 2.2 wt % or less, 2% or less, 1.6 wt % or less, 1.55 wt % or less, 1.5 wt % or less, 1.4 wt % or less, or even 1.3 wt % or less. The concentration of the vinyl functionality can be calculated by 27*2/Mw, where Mw is the molecular weight of the vinyldimethylsiloxy-terminated PDMS. The Mw of the vinyldimethylsiloxy-terminated PDMS can be determined by its chemical structure characterized by standard $^{1}H$, $^{13}C$ and $^{29}Si$ nuclear magnetic resonance (NMR) analysis.

Suitable divinyl PDMS materials can be made by ring-opening polymerization of cyclosiloxanes with vinyl end blockers for termination as taught in U.S. Pat. No. 5,883,215A. Suitable divinyl PDMS that is commercially available includes polysiloxane available under the name DMS-V21 from Gelest.

The SiH functional crosslinker (a2) useful in the present invention can be a polysiloxane containing SiH functionality. Desirably, the SiH functional crosslinker contains 2 or more, even 3 or more, SiH functionalities per molecule. Preferably, the SiH functional crosslinker has a concentration of hydrogen atom (H) as SiH (i.e., the concentration of silicon-bonded hydrogen atom), of 0.1 wt % or more, 0.2 wt % or more, 0.3 wt % or more, 0.4 wt % or more, 0.5 wt % or more, and can be 0.6 wt % or more, 0.7 wt % or more, 0.8 wt % or more, even 0.9 wt % or more, while at the same time is generally 1.0 wt % or less, 0.9 wt % or less, 0.8 wt % or less, 0.7 wt % or less, 0.6 wt % or less, 0.5 wt % or less, 0.4 wt % or less, or even 0.3 wt % or less, based on weight of the SiH functional crosslinker. The content of silicon-bonded hydrogen atoms can be determined by NMR analysis.

The SiH functional crosslinker can desirably comprise one or more than one polysiloxane having chemical structures selected from (II), (III), or combinations thereof:

$$H(CH_3)_2SiO—[(CH_3)_2)SiO)]_x—Si(CH_3)_2H \quad (II)$$

$$(CH3)_3SiO—[(CH_3)HSiO]_y[(CH_3)_2)SiO]_z—Si(CH_3)_3 \quad (III)$$

where subscript x has a value in a range of 10 to 100, and can be 10 or more, 15 or more, 20 or more, 30 or more, 40 or more, 50 or more, 60 or more, 70 or more, even 80 or more and at the same time is generally 100 or less, 90 or less, 80 or less, 70 or less, 60 or less, 50 or less, 40 or less, 30 or less, or even 20 or less;

subscript y has a value in a range of 3 to 30, and can be 3 or more, 4 or more, 5 or more, 10 or more, 15 or more, 20 or more, even 25 or more and at the same time is generally 30 or less, 25 or less, 20 or less, 15 or less, 10 or less, 9 or less, 8 or less, 7 or less, 6 or less, 5 or less, or even 4 or less; and subscript z has a value in a range of 3 to 100, and can be 3 or more, 5 or more, 10 or more, 15 or more, 20 or more, 30 or more, 40 or more, 50 or more, 60 or more, 70 or more, even 80 or more while at the same time is generally 100 or less, 90 or less, 80 or less, 70 or less, 60 or less, 50 or less, 40 or less, 30 or less, 20 or less, 10 or less and can be 5 or less, or even 4 or less.

Suitable commercially available SiH functional cross-linkers include those available under the names HMS-071, HMS-301 and DMS-H11 all available from Gelest.

The hydrosilylation catalyst (a3) useful in the present invention can be any hydrosilylation catalyst. The hydrosilylation catalyst may comprise a platinum-based catalyst such as Speier's catalyst ($H_2PtCl_6$) and/or Karstedt's catalyst (an organoplatinum compound derived from divinyl-containing disiloxane, also identified as platinum-divinyltetramethyldisiloxane complex or 1,3-diethenyl-1,1,3,3 tetramethyldisiloxane platinum complex). The hydrosilylation catalyst can be encapsulated (typically, in a phenyl resin) or non-encapsulated. Exemplary hydrosilylation reaction catalysts are described in U.S. Pat. Nos. 3,159,601 and 3,220,972. The hydrosilylation catalyst is typically present at a concentration of 0.01 wt % or more, 0.02 wt % or more, 0.03 wt % or more, 0.04 wt % or more, or even 0.05 wt % or more while at the same time is generally 0.10 wt % or less, 0.09 wt % or less, 0.08 wt % or less, 0.07 wt % or less, or even 0.06 wt % or less, based on the weight of the thermally conductive composition.

The thermally conductive composition of the present invention also comprises one or more filler treating agent. The filler treating agent comprises an alkyltrialkoxysilane (B1), a mono-trialkoxysiloxy terminated dimethylpolysiloxane (B2), or a mixture of (B1) and (B2).

The alkyltrialkoxysilane can be an alkyltrimethoxysilane. The alkyltrialkoxysilane may be a 6 to 20 carbon ($C_6$-$C_{20}$) alkyl trimethoxy silane and can be a $C_6$-$C_{12}$ alkyl trimethoxy silane, and preferably a $C_8$-$C_{12}$ alkyl trimethoxy silane and can be n-decyltrimethoxy silane. Suitable alkyltrialkoxysilanes include n-decyltrimethoxysilane, available from Dow, Inc. as DOWSIL™ Z-6210 Silane (DOWSIL is a trademark of The Dow Chemical Company) or under the name SID2670.0 from Gelest.

Examples of suitable mono-trialkoxysiloxy terminated dimethylpolysiloxanes have chemical structure (IV):

$$(CH_3)_2SiO—[(CH_3)_2SiO]_a—Si(OR')_3 \quad (IV)$$

where subscript a has a value in a range of from 20 to 150, and can be 20 or more, 30 or more, 40 or more, 50 or more, 60 or 30 more, 70 or more, 80 or more, or even 90 or more while at the same time is typically 150 or less, 140 or less, 130 or less, 120 or less, 110 or less, 100 or less, 90 or less, 80 or less, 70 or less, 60 or less, 50 or less, 40 or less, or even 30 or less. R' is an alkyl group, preferably containing 1 to 12 carbon atoms ($C_1$-$C_{12}$), and most preferably is methyl. Desirably, the mono-trialkoxysiloxy terminated dimethylpolysiloxane is a mono-trimethoxy terminated dimethyl polysiloxane.

Suitable mono-trialkoxysiloxy terminated dimethylpolysiloxanes can be synthesized according the teachings in US2006/0100336. Desirably, the mono-trialkoxysiloxy terminated dimethylpolysiloxane is typically present at a concentration of 0.5 wt % or more, 0.6 wt % or more, 0.7 wt % or more, 0.8 wt % or more, 0.9 wt % or more, 1.0 wt % or more, 1.1 wt % or more, 1.2 wt % or more, 1.3 wt % or more, 1.4 wt % or more, 1.5 wt % or more, even 1.6 wt % or more, while at the same time is typically present at a concentration of 3.0 wt % or less, 2.9 wt % or less, 2.8 wt % or less, 2.7 wt % or less, 2.6 wt % or less, 2.5 wt % or less, 2.4 wt % or less, 2.3 wt % or less, 2.2 wt % or less, 2.1 wt % or less, 2.0 wt % or less, 1.9 wt % or less, 1.8 wt % or less, or even 1.7 wt % or less, based on the weight of the thermally conductive composition. At the same time, or alternatively, the alkyltrialkoxysilane may be present at a concentration of 0.05 wt % or more, 0.1 wt % or more, 0.2 wt % or more, 0.3 wt % or more, or even 0.4 wt % or more while at the same time is typically present at a concentration of 0.5 wt % or less, 0.4 wt % or less, 0.3 wt % or less, or even 0.2 wt % or less, based on the weight of the thermally conductive composition.

The thermally conductive composition of the present invention further comprises a thermally conductive filler mixture (C). The thermally conductive filler mixture (C) contains all of the thermally conductive filler in the thermally conductive composition. Thermally conductive filler refers to particulates that facilitate thermal conduction through the thermally conductive composition.

The thermally conductive filler mixture useful in the present invention comprises aluminum nitride fillers (c1) which comprises a blend of two different aluminum nitride fillers (c1-a) and (c1-b).

The (c1-a) aluminum nitride fillers are spherical aluminum nitride particles having a D50 particle size of 100 μm or more. "Spherical" shaped particles refer to particles that have an aspect ratio of 1.0+/−0.2. Determine the aspect ratio of a particle using scanning electron microscope (SEM) imaging and by taking the average ratio of the longest dimension (major axis) and shortest dimension (minor axis) of at least ten particles.

The spherical aluminum nitride particles (c1-a) have a D50 particle size of 100 μm or more, and can be greater than 100 μm, 105 μm or more, 110 μm or more, 115 μm or more, or even 120 μm or more. The spherical aluminum nitride fillers (c1-a) may have a D50 particle size of 200 μm or less, 190 μm or less, 180 μm or less, 175 μm or less, 170 μm or less, 160 μm or less, 150 μm or less, 140 μm or less, 130 μm or less, or even 120 μm or less. The spherical aluminum nitride particles (c1-a) may be present at a concentration of from 15 wt % to 41 wt %, and can be 15 wt % or more, 16 wt % or more, 17 wt % or more, 18 wt % or more, 19 wt % or more, 20 wt % or more, 21 wt % or more, 22 wt % or more, 24 wt % or more, 25 wt % or more, 28 wt % or more, 30 wt % or more, or even 32 wt % or more, while at the same time is typically present at a centration of 41 wt % or less, 40 wt % or less, 39 wt % or less, 38 wt % or less, 37 wt % or less, 36.5 wt % or less, or even 36 wt % or less, preferably, from 30 wt % to 38 wt %, based on the weight of the thermally conductive composition.

The (c1-b) aluminum nitride fillers are spherical or irregular shaped aluminum nitride particles having a D50 particle size of from 20 to 80 μm. "Irregular" shaped particles have an aspect ratio other than 1.0+/−0.2 and have at least three faces evident by SEM imaging (distinguishing the particles from "platelets", which have 2 faces). The spherical or irregular shaped aluminum nitride particles (c1-b) have a D50 particle size of 20 μm or more, 22 μm or more, 25 μm or more, 28 μm or more, 30 μm or more, 32 μm or more, 35 μm or more, 38 μm or more, or even 40 μm or more while at the same time have a D50 particle size of 80 μm or less, 75 μm or less, 70 μm or less, 65 μm or less, 60 μm or less, 55 μm or less, 50 μm or less, or even 45 μm or less. Desirably, the spherical or irregular shaped aluminum nitride particles (c1-b) have a D50 particle size of from 50

μm to 80 μm. The aluminum nitride particles (c1-b) can be spherical aluminum nitride particles, irregular shaped aluminum nitride particles, or mixtures thereof. The spherical or irregular shaped aluminum nitride particles (c1-b) may be present at a concentration of from 10 wt % to 39 wt %, and can be 10 wt % or more, 10.5 wt % or more, 11 wt % or more, 11.5 wt % or more, 12 wt % or more, 12.5 wt % or more, 13 wt % or more, 13.5 wt % or more, 14 wt % or more, or even 14.5 wt % or more, while at the same time is typically present at a concentration of 39 wt % or less, 38 wt % or less, 37 wt % or less, 36 wt % or less, 35 wt % or less, 32 wt % or less, 30 wt % or less, 29 wt % or less, 28 wt % or less, 25 wt % or less, 22 wt % or less, 20 wt % or less, or even 19 wt % or less, based on the weight of the thermally conductive composition. Desirably, the spherical or irregular shaped aluminum nitride particles (c1-b) is present at a concentration of from 14 wt % to 20 wt %, based on the weight of the thermally conductive composition.

Preferably, the blend of aluminum nitride particles is a mixture of from 30% to 38% of the spherical aluminum nitride particles (c1-a) with a D50 particle size of 100 μm or more, and from 14% to 20% of the spherical or irregular shaped aluminum nitride particles (c1-b) with a D50 particle size of from 50 μm to 80 μm. Alternatively, the blend of aluminum nitride particles can be a mixture of from 30 wt % to 38 wt % of the spherical aluminum nitride particles (c1-a) with a D50 particle size of 100 μm or more, and from 14 wt % to 20 wt % of the spherical or irregular shaped aluminum nitride particles (c1-b) with a D50 particle size of from 20 μm to 40 μm.

The concentration of the aluminum nitride fillers (c1) from this blend, desirably as a sum of (c1-a) and (c1-b), and more desirably as a sum of any and all aluminum nitride fillers in the thermally conductive composition, is from 40 wt % to 55 wt %, and can be 40 wt % or more, 41 wt % or more, 42 wt % or more, 43 wt % or more, 44 wt % or more, 45 wt % or more, 46 wt % or more, 47 wt % or more, 48 wt % or more, 49 wt % or more, or even 50 wt % or more while at the same time is generally 55 wt % or less, 54 wt % or less, 53 wt % or less, 52 wt % or less, or even 51 wt % or less, and can be from 45 wt % to 55 wt %, based on the weight of the thermally conductive composition.

Spherical aluminum nitride particles in this blend are typically present at a concentration of greater than 60 wt %, for example, 61 wt % or more, 62 wt % or more, 64 wt % or more, 65 wt % or more, 66 wt % or more, 68 wt % or more, 70 wt % or more, 71 wt % or more, 73 wt % or more, 75 wt % or more, 76 wt % or more, 78 wt % or more, or even 80 wt % or more while at the same time can be present at a concentration of 100 wt % or less, for example, can be 98 wt % or less, 95 wt % or less, 92 wt % or less, 90 wt % or less, 88 wt % or less, 85 wt % or less, or even 82 wt % or less, based on the total weight of the blend (i.e., the total weight of aluminum nitride particles (c1-a) and (c1-b)). Desirably, spherical aluminum nitride particles with a D50 particle size of 20 μm or more are at the same concentrations as described here, based on the total weight of aluminum nitride fillers having a D50 particle size of 20 μm or more in the thermally conductive composition. At the same time or alternatively, spherical aluminum nitride particles with a D50 particle size of 30 μm or more are at the same concentrations as described here, based on the total weight of aluminum nitride fillers having a D50 particle size of 30 μm or more in the thermally conductive composition.

The thermally conductive composition of the present invention can have additional aluminum nitride particles (c1-c) in addition to this particular blend of aluminum nitride particles (c1-a) and (c1-b) described above or the thermally conductive composition can be free of additional aluminum nitride particles (c1-c) in addition to this particular blend of (c1-a) and (c1-b) described above.

The thermally conductive filler mixture useful in the present invention further comprises spherical aluminum oxide particles (c2). The spherical aluminum oxide particles (c2) have a D50 particle size of 1 μm or more, and can be 1.2 μm or more, 1.5 μm or more, 1.8 μm or more, or even 2 μm or more while at the same time typically have a D50 particle size of 5 μm or less, 4.8 μm or less, 4.5 μm or less, 4.2 μm or less, 4 μm or less, 3.8 μm or less, 3.5 μm or less, 3.2 μm or less, 3 μm or less, 2.8 μm or less, or even 2.5 μm or less. The spherical aluminum oxide particles (c2) may be present at a centration of 27 wt % or more, 28 wt % or more, 29 wt % or more, or even 30 wt % or more while at the same time is generally present at a concentration of 41 wt % or less, 40 wt % or less, 39 wt % or less, 38% or less, 37 wt % or less, 36 wt % or less, 35 wt % or less, 33 wt % or less, 32 wt % or less, or even 31 wt % or less, based on the weight of the thermally conductive composition.

The thermally conductive filler mixture useful in the present invention further comprises irregular shaped zinc oxide particles (c3). The irregular shaped zinc oxide particles have a D50 particle size of from 0.1 μm to 0.5 μm, and can be 0.1 μm or more, 0.11 μm or more, or even 0.12 μm or more while at the same time typically have a D50 particle size of 0.5 μm or less, 0.45 μm or less, 0.4 μm or less, 0.35 μm or less, 0.3 μm or less, 0.25 μm or less, 0.2 μm or less, or even 0.15 μm or less. The irregular shaped zinc oxide particles (c3) may be present at a concentration of from 10 wt % to 20 wt %, and can be 11 wt % or more, 12 wt % or more, 13 wt % or more, or even 14 wt % or more while at the same time is typically present at a concentration of 20 wt % or less, 19 wt % or less, 18 wt % or less, 17 wt % or less, 16 wt % or less, 15 wt % or less, or even 14.5 wt % or less, based on the weight of the thermally conductive composition.

The thermally conductive filler mixture can comprise one or more than one additional thermally conductive filler (c4) in addition to those mentioned or can be free of additional thermally conductive fillers other than those mentioned (e.g., (c1-a), (c1-b), (c2) and (c3)). The additional thermally conductive fillers may include metal nitrides and metal oxides other than (c1-a), (c1-b), (c2) and (c3) described above, for example, the additional aluminum nitride particles (c1-c), boron nitride, magnesium oxide, or mixtures thereof.

The additional aluminum nitride particles (c1-c) useful in the present invention can have a D50 particle size of less than 20 μm, for example, 18 μm or less, 15 μm or less, 12 μm or less, 10 μm or less, 8 μm or less, or even 5 μm or less, while at the same time can have a D50 particle size of 1 μm or more, 1.5 μm or more, 2 μm or more, 3 μm or more, or even 4 μm or more. The concentration of the additional aluminum nitride particles (c1-c) can be from zero to 10 wt %, for example, 8 wt % or less, 7 wt % or less, 5 wt % or less, 4 wt % or less, 3 wt % or less, or even 2 wt % or less, while at the same time is typically 0.5 wt % or more, 1 wt % or less, or even 1.5 wt % or more, based on the weight of the thermally conductive composition.

The boron nitride fillers useful in the present invention typically have a D50 particle size of more than 20 μm, for example, 30 μm or more, 40 μm or more, 50 μm or more, 60 μm or more, 70 μm or more, 80 μm or more, 90 μm or more, 100 μm or more, or even 110 μm or more, while at the same time have a D50 particle size of 200 μm or less, 175 μm or less, 160 μm or less, 150 μm or less, 140 μm or less, 130 μm or less, or even 125 μm or less. The boron nitride fillers may be present in an amount of from zero to 5 wt %, for example, 4.5 wt % or less, 4 wt % or less, 3.5 wt % or less, 3 wt % or less, less than 2.1 wt %, less than 2.0 wt %, less than 1.6 wt %, less than 1.5 wt %, less than 1.2 wt %, less than 1 wt %, less than 0.9 wt %, less than 0.8 wt %, less than 0.7 wt %, less than 0.6 wt %, less than 0.5 wt %, less than 0.4 wt %, less than 0.3 wt %, less than 0.2 wt %, less than 0.1 wt %, or even zero, and can be from zero to less than 1 wt %, based on the weight of the thermally conductive composition.

The magnesium oxide fillers useful in the present invention typically have a D50 particle size of 50 μm or more, 60 μm or more, 70 μm or more, 90 μm or more, or even 120 μm or more while at the same time can have a D50 particle size of 150 μm or less, 140 μm or less, or even 130 μm or less. The magnesium oxide fillers may be present in an amount of from zero to 20 wt %, for example, 20 wt % or less, 18 wt % or less, 16 wt % or less, 14 wt % or less, 12 wt % or less, or even 10 wt % or less, based on the weight of the thermally conductive composition.

The total concentration of the additional thermally conductive filler (c4), which comprises or consists of the additional aluminum nitride particles (c1-c), boron nitride, magnesium oxide, or mixtures thereof, can be from zero to 20 wt %, for example, 20 wt %, 18 wt % or less, 15 wt % or less, 12 wt % or less, or even 11 wt % or less, based on the weight of the thermally conductive composition.

The thermally conductive filler mixture in the thermally conductive composition desirably consists of the aluminum nitride fillers (c1-a) and (c1-b), the spherical aluminum oxide particles (c2) and the irregular shaped zinc oxide (c3). The thermally conductive filler mixture (and thermally conductive composition as a whole) can be free of magnesium oxide fillers, boron nitride fillers, the additional aluminum nitride particles (c1-c), or any combination thereof.

The concentration of thermally conductive filler mixture in the thermally conductive composition is 94 wt % or more, 94.2 wt % or more, 94.5 wt % or more, 94.8 wt % or more, 95 wt % or more, 95.1 wt % or more, 95.2 wt % or more, 95.3 wt % or more, 95.4 wt % or more, 95.5 wt % or more, 95.6 wt % or more, or even 95.7 wt % or more while at the same time is generally 97 wt % or less, 96.9 wt % or less, 96.8 wt % or less, 96.7 wt % or less, 96.6 wt % or less, 96.5 wt % or less, 96.4 wt % or less, 96.3 wt % or less, 96.2 wt % or less, 96.1 wt % or less, or even 96 wt % or less, based on the weight of the thermally conductive composition.

The thermally conductive composition of the present invention may comprise or be free of one or more inhibitor (hydrosilylation reaction inhibitor) useful for altering rate of reaction of the silicon-bonded hydrogen atoms and vinyl groups in the composition, as compared to reaction rate of the same composition but with the inhibitor omitted. Examples of suitable inhibitors include acetylene-type compounds such as 2-methyl-3-butyn-2-ol, 3-methyl-1-butyn-3-ol, 3,5-dimethyl-1-hexyn-3-ol, 2-phenyl-3-butyn-2-ol, 3-phenyl-1-butyn-3-ol, 1-ethynyl-1-cyclohexanol, 1,1-dimethyl-2-propynyl)oxy)trimethylsilane and methyl(tris(1,1-dimethyl-2-propynyloxy))silane; ene-yne compounds such as 3-methyl-3-penten-1-yne and 3,5-dimethyl-3-hexen-1-yne; triazols such as benzotriazole; hydrazine-based compounds; phosphines-based compounds; mercaptane-based compounds; cycloalkenylsiloxanes including methylvinylcyclosiloxanes such as 1,3,5,7-tetramethyl-1,3,5,7-tetravinyl cyclotetrasiloxane and 1,3,5,7-tetramethyl-1,3,5,7-tetrahexenyl cyclotetrasiloxane; or combinations thereof. The inhibitor may be present in an amount of from zero to 0.3 wt %, and can be 0.0001 wt % or more, 0.001% wt % or more, 0.002 wt % or more, 0.005 wt % or more, or even 0.01 wt % or more while at the same time is generally 0.3 wt % or less, 0.2 wt % or less, 0.1 wt % or less, 0.05% or less, or even 0.03 wt % or less, based on the weight of the thermally conductive composition.

The thermally conductive composition of the present invention can further comprise or be free of any one or any combination of more than one of the following additional components: heat stabilizers and/or pigments (such as copper phthalocyanine powder), thixotropic agents, fumed silica (preferably, surface treated), and spacer additives (such as glass beads). The total concentration for these additional components can be in a range of from zero to 2 wt %, and can be zero or more, 0.1 wt % or more, 0.2 wt % or more, 0.3 wt % or more, 0.4 wt % or more, or even 0.5 wt % or more, while at the same time is typically 2 wt % or less, and can be 1.9 wt % or less, 1.8 wt % or less, 1.6 wt % or less, 1.5 wt % or less, 1.4 wt % or less, 1.2 wt % or less, 1 wt % or less, 0.8 wt % or less, or even 0.6 wt % or less.

The thermally conductive composition of the present invention achieves an extrusion rate of greater than 60 g/min. Determine extrusion rates herein at a pressure of 0.62 MegaPascals (90 pounds per square inch) with a standard 30 cubic centimeters EFD syringe package (further details provided below under Extrusion Rate Characterization). The thermally conducive composition may have an extrusion rate of 65 g/min or more, 68 g/min or more, 70 g/min or more, 72 g/min or more, 75 g/min or more, 78 g/min or more, or even 80 g/min or more. ER is a useful characteristic as a measure of extrudability, viscosity, dispensability and usability, which, for example, makes the thermally conductive composition easily dispensable for applying onto another material such as electronic components or heat sinks. At the same time, the thermally conductive composition of the present invention provides a thermal conductivity of at least 9.0 W/m*K as measured according to ASTM D5470-06 using LonGwin Model LW 9389 TIM thermal resistance and conductivity measurement apparatus. Having such a high thermal conductivity and by being easily dispensable makes the thermally conductive composition particularly useful as thermal interface materials (TIMs). TIMs are used to thermally couple two articles or components of a device. For instance, a TIM is useful to thermally couple a heat generating device with a heat sink, cooling plate, metal cover or other heat dissipating component, especially in electronics. In such an application, the thermally conductive composition resides between and in thermal contact with at least two components, typically a heat generating device and at least one of a heat sink, cooling plate, metal cover or other heat dissipating component.

EXAMPLES

Some embodiments of the invention will now be described in the following Examples, wherein all weight percentages are relative to the weight of the thermally conductive composition and all particle sizes of fillers are D50 particle sizes, unless otherwise specified. Table 1 lists the materials for use in the thermally conductive composition of the samples described herein below. Note: "Vi" refers to a vinyl group. "Me" refers to a methyl group. SYL-OFF and DOWSIL are trademarks of The Dow Chemical Company.

TABLE 1

| Component | Description | Source |
|---|---|---|
| Vi Polymer A1-1 | Vinyl dimethyl terminated PDMS (with viscosity of 78 mPa * s and 1.25 wt % vinyl) | Available as SMS-V21 from Gelest |
| Vi Polymer A1-2 | Vinyl dimethyl terminated PDMS (with viscosity of 60 mPa * s and 1.55 wt % vinyl). Average chemical structure: $ViMe_2SiO—[Me_2SiO]_{45}—SiMe_2Vi$. | Synthesize by ring-opening polymerization of cyclosiloxanes with vinyl end-blockers for termination as described in U.S. Pat. No. 5,883,215. |
| Crosslinker A2-1 | Trimethyl terminated dimethyl-co-hydrogen methyl polysiloxane with viscosity of 19 mPa * s and 0.11 wt % H. | Available as HMS-071 from Gelest. |
| Crosslinker A2-2 | Trimethyl terminated dimethyl-co-hydrogen methyl polysiloxane with viscosity of 14 mPa * s and 0.36 wt % H | Available as HMS-301 from Gelest. |
| Crosslinker A2-3 | Hydride terminated PDMS with viscosity of 7-10 mPa * s and 0.16 wt % H. | Available as HMS-H11 from Gelest. |
| Treating Agent B-1 | n-decyltrimethoxysilane | Available as SID2670.0 from Gelest. |
| Treating Agent B-2 | Monotrimethoxysiloxy and trimethylsiloxy terminated PDMS having an average molecular structure of: $Me_3SiO[Me_2SiO]_{30}Si(OMe_3)_3$ | Synthesize according to the teachings in US2006/0100336 |
| TC Filler C1-1 | Spherical aluminum nitride (AlN) particles with a D50 particle size of 80 μm | Available from Maruwa Ceramic Co., Ltd. of Japan |
| TC Filler C1-2 | Spherical AlN particles with a D50 particle size of 30 μm | Available from Maruwa Ceramic Co., Ltd. of Japan |
| TC Filler C1-3 | Spherical AlN particles with a D50 particle size of 50 μm | Available from Bestry Performance Materials Co., Ltd. of China |
| TC Filler C1-4 | Spherical AlN particles with a D50 of 120 μm | Available from Bestry Performance Materials Co., Ltd. of China |
| TC Filler C1-5 | Spherical AlN particles with a D50 particle size of 100 μm | Available from Ginet New Material Technology Co., Ltd. of China |
| TC Filler C1-6 | Irregular AlN particles with a D50 of 70 μm | Available from Combustion Synthesis Co. Ltd. of Japan |
| TC Filler C1-7 | Irregular AlN particles with a D50 particle size of 60 μm | Available from Combustion Synthesis Co., Ltd. of Japan |
| TC Filler C1-8 | Irregular AlN particles with a D50 particle size of 20 μm | Available from Combustion Synthesis Co., Ltd. of Japan |
| TC Filler C1-9 | Spherical magnesium oxide (MgO) particles with a D50 particle size of 60 μm | Available from Denka of Japan |
| TC Filler C1-10 | Irregular AlN particles with a D50 particle size of 100 μm | Available from Jufeng Advanced Materials Technology Co., Ltd. of China |
| TC Filler C1-11 | Spherical MgO particles with a D50 particle size of 120 μm | Available from Denka of Japan |
| TC Filler C2-1 | Spherical Aluminum Oxide (Alumina, $Al_2O_3$) with a D50 particle size of 2 μm | Available from Showa Denko Co., Ltd. of Japan. |
| TC Filler C2-2 | Irregular $Al_2O_3$ particles with a D50 particle size of 2 μm | Available from Alteo Shanghai Co., Ltd. of China |
| TC Filler C2-3 | Spherical $Al_2O_3$ particles with a D50 particle size of 10 μm | Available from Denka of Japan |
| TC Filler C3-1 | Crushed zinc oxide (ZnO) particles with a D50 particle size of 0.12 μm | Available from Zochem, Inc. |
| TC Filler C3-2 | Spherical $Al_2O_3$ with a D50 particle size of 0.3 μm | Available from Denka of Japan |
| TC Filler C3-3 | Crushed $Al_2O_3$ particles with a D50 particles size of 0.2 μm | Available from Alteo Shanghai Co., Ltd. of China |
| TC Filler C4-1 | Boron nitride (BN) with a D50 particle size of 125 μm | Available from Momentive Performance Materials, USA |
| Catalyst D-1 | Karstedt's Catalyst composition | Available as SYL-OFF ™ 4000 catalyst from the Dow Chemical Company. |
| Inhibitor E-1 | Methyl(tris(1,1-dimethyl-2-propynyloxy))silane | Available from Alfa Chemistry as ACM83817714 |
| Pigment F-1 | Copper phthalocyanine powder (CuPc) (40- wt %) dispersed by 3-roll mill in trimethyl terminated PDMS, 350 mPa * s viscosity | Copper Phthalocyanine Powder available as Alfa-Aesar Catalogue No. 43650-09 and PDMS is DOWSIL ™ 200 Fluid 350 cSt. |

*Viscosities of polysiloxanes were measured by ASTM D445-21; "TC filler" refers to thermally conductive filler; "Crushed" particles are particles having one or more sharp, angular, fractured faces; and herein crushed particles also refer to irregular shaped particles.

IE 1-11 and CE 1-16 Samples

Formulations for the samples are in Tables 2 and 3, with the amount of each component reported in grams (g).

Samples were prepared by using a SpeedMixer™ DAC 400 FVZ mixer from FlackTek Inc. (South Carolina, USA) to mix the components together. To a cup of the SpeedMixer add the Vi Polymer, Crosslinker, Treating Agent, and the C2 and C3 TC fillers. Mix at 1000 revolutions per minute (RPM) for 20 seconds, then 1500 RPM for 20 seconds. Add half of the C1 TC fillers was further added and mixed at 1000 revolutions per minute (RPM) for 20 seconds, then 1500 RPM for 20 seconds. The remaining C1 TC fillers were added, followed by addition of C4-1 TC filler if present. and mixed in the same way. The resulting composition in the cup was scraped to ensure mixing and then the Inhibitor E-1, Pigment F-1 and Catalyst D-1 were added and mixed in like manner to obtain the thermally conductive composition samples. The obtained thermally conductive composition samples were evaluated for extrusion rate and thermal conductivity according to the following test methods:

Extrusion Rate Characterization

Determine extrusion rate ("ER") for a sample using Nordson EFD dispensing equipment. Package sample material into a 30 cubic centimeter syringe with a 2.54 millimeter (mm) opening (EFD syringe form Nordson Company). Dispense sample through the opening by applying a pressure of 0.62 MPa to the syringe. The mass of the sample in grams (g) extruded after one minute corresponds to the extrusion rate in grams per minute (g/min). The objective of the present invention is to achieve an extrusion rate of greater than 60 g/min, preferably 65 g/min or more, more preferably 70 g/min or more, and even more preferably 75 g/min or more.

Notably, some samples were powdery pastes that could not be extruded so they are reported as having an ER of 0 (and thermal conductivity was not measured).

Thermal Conductivity Characterization

Determine thermal conductivity ("TC") according to ASTM D5470-06 using LonGwin Model LW 9389 TIM thermal resistance and conductivity measurement apparatus from LonGwin Science and Technology Corporation, Taiwan. The objective of the present invention is to achieve a thermal conductivity of at least 9.0 Watts per meter*Kelvin (W/m*K), also denoted as "TC-LonGwin".

The thermally conductive composition samples (non-cured samples) were applied between guarded central hot and cold plates when operating at 80° C. for 12 minutes. A pressure of 275.8 KiloPascals (40 pounds per square inch) was applied to maintain samples in contact with the plates. Thermal impedance was measured at different bond-line thickness (BLT) (0.5 mm/1.0 mm/2.0 mm). By fitting a linear equation to Thermal Impedance vs. BLT, the bulk thermal conductivity (denoted as "K") was calculated by K=10/slope and reported as "TC-LonGwin" in Table 2 and 3.

As shown in Table 2, all Exs 1-11 samples achieved both requirements of an ER of greater than 60 g/min and a TC of greater than 9.0 W/m*K. Particularly, Exs 1-10 showed even higher ER of 75 g/min or more.

In contrast, the samples as given in Table 3 failed to achieve at least one of TC and ER requirements.

CE1 sample using the combination of AlN particles (D50=80 μm) and spherical MgO (D50=60 μm) instead of the combination of at least two types of AlN particles with specific particle sizes provided the TC below 9.0 W/m*K.

CE2 sample using the combination of AlN particles (D50=80 μm), irregular AlN particles (D50=60 μm), irregular shaped $Al_2O_3$ particles (D50=2 μm), and spherical $Al_2O_3$ particles (D50=10 μm) as TC fillers was a powdery paste that could not be extruded.

CE3 sample using AlN particles (D50=80 μm), spherical $Al_2O_3$ particles in different particle sizes (2 μm and 0.3 μm, respectively) gave TC below 9.0 W/m*K.

CE4 sample comprising spherical AlN particles (D50=80 μm) with irregular AlN particles (D50=70 μm) instead of spherical AlN particle with D50 of 100 μm or more provided both low ER and lower TC.

CE5 sample comprising spherical AlN particles (D50=80 μm), spherical MgO particles (D50=120), and spherical $Al_2O_3$ particles in different particle sizes (D50=2 μm and 0.3 μm respectively) as TC fillers provided both low ER and low TC.

As compared with Ex 2, replacing spherical $Al_2O_3$ particles with D50 of 2 μm with irregular shaped $Al_2O_3$ particles (CE6 sample), replacing irregular ZnO particles (D50=8.2 μm) with spherical or irregular shaped $Al_2O_3$(CE7 and CE8 samples), or replacing the spherical AlN with D50 of 120 μm with irregular shaped AlN with D50 of 100 μm (CE9) all resulted in lower ER.

CE10 only comprising one type of AlN particles having D50 of 80 μm even with the addition of 2.1% of BN particles still failed to meet the TC requirement of TC of greater than 9.0 W/m*K.

CE11 and CE14 samples both comprising a mixture of AlN particles with two different particle sizes while AlN particles with a D50 particle size of 100 μm or more at concentrations of 45 wt % and 10 wt %, respectively, failed to meet at least one of the requirements for ER and TC.

CE12 and CE13 samples demonstrate that the total concentration of AlN fillers of lower than 40% provided undesirably low TC, and the total content of AlN fillers >55 wt % resulted in low ER.

CE15 sample comprising only one type of AlN fillers, i.e., irregular shaped AlN particles with D50 of 20 μm, was a powdery paste that could not be extruded. CE16 sample comprising only spherical AlN particles with D50 of 100 μm as AlN fillers provided an ER of lower than 60 g/min.

TABLE 2

Compositions and Characterization of Samples (IE 1-11)

| | IE 1 | IE 2 | IE 3 | IE 4 | IE 5 | IE 6 | IE 7 | IE 8 | IE 9 | IE 10 | IE 11 |
|---|---|---|---|---|---|---|---|---|---|---|---|
| Component | | | | | | | | | | | |
| Vinyl polymer A1-2 | 1.80 | 1.80 | 1.80 | 1.713 | 1.80 | 1.80 | 1.80 | 1.80 | 1.80 | 1.80 | 1.80 |
| SiH crosslinker A2-2 | 0.04 | 0.04 | 0.04 | 0.038 | 0.04 | 0.04 | 0.04 | 0.04 | 0.04 | 0.04 | 0.04 |
| SiH crosslinker A2-3 | 0.50 | 0.50 | 0.50 | 0.476 | 0.50 | 0.50 | 0.50 | 0.50 | 0.50 | 0.50 | 0.50 |
| Treating Agent B-1 | 0.20 | 0.20 | 0.20 | 0.190 | 0.20 | 0.20 | 0.20 | 0.20 | 0.20 | 0.20 | 0.20 |
| Treating Agent B-2 | 1.70 | 1.70 | 1.70 | 1.618 | 1.70 | 1.70 | 1.70 | 1.70 | 1.70 | 1.70 | 1.70 |
| TC Filler C1-1 | | | | 28.544 | | | | | 12.5 | | |
| TC Filler C1-2 | 18.70 | | | | 14.50 | | | | | | |
| TC Filler C1-3 | | | 18.70 | | | | 35.70 | 10.00 | | | 38.70 |
| TC Filler C1-4 | | 36.20 | | | 36.20 | | | | | | |

TABLE 2-continued

Compositions and Characterization of Samples (IE 1-11)

| | IE 1 | IE 2 | IE 3 | IE 4 | IE 5 | IE 6 | IE 7 | IE 8 | IE 9 | IE 10 | IE 11 |
|---|---|---|---|---|---|---|---|---|---|---|---|
| TC Filler C1-5 | 32.00 | | 32.00 | 22.455 | | 32.00 | 15.00 | 40.70 | 33.00 | 30.50 | 15.50 |
| TC Filler C1-6 | | 14.50 | | | | | | | | 10.00 | |
| TC Filler C1-8 | | | | | | 18.70 | | | | | |
| TC Filler C2-1 | 30.50 | 30.50 | 30.50 | 30.447 | 30.50 | 30.50 | 30.50 | 30.50 | 35.70 | 40.70 | 27.30 |
| TC Filler C3-1 | 14.50 | 14.50 | 14.50 | 14.462 | 14.50 | 14.50 | 14.50 | 14.50 | 14.50 | 14.50 | 14.20 |
| Catalyst D-1 | 0.06 | 0.06 | 0.06 | 0.057 | 0.06 | 0.06 | 0.06 | 0.06 | 0.06 | 0.06 | 0.06 |
| Inhibitor E-1 | 0.002 | 0.002 | 0.002 | 0.002 | 0.002 | 0.002 | 0.002 | 0.002 | 0.002 | 0.002 | 0.002 |
| Characterization | | | | | | | | | | | |
| SiH/Vi Ratio | 0.80 | 0.80 | 0.80 | 0.80 | 0.80 | 0.80 | 0.80 | 0.80 | 0.80 | 0.80 | 0.80 |
| Wt % Filler | 95.7 | 95.7 | 95.7 | 95.9 | 95.7 | 95.7 | 95.7 | 95.7 | 95.7 | 95.7 | 95.7 |
| Vol % Filler | 85.3 | 85.3 | 85.3 | 85.9 | 85.3 | 85.3 | 85.3 | 85.3 | 85.2 | 85.1 | 85.4 |
| Wt % Spherical large AlN | 32.0 | 36.0 | 32.0 | 22.5 | 36.2 | 32.0 | 15.0 | 40.7 | 33.0 | 30.5 | 15.5 |
| Wt % Small AlN | 18.7 | 14.5 | 18.7 | 28.5 | 14.5 | 18.7 | 35.7 | 10.0 | 12.5 | 10.0 | 38.7 |
| Wt % Total AlN | 50.7 | 50.5 | 50.7 | 51.0 | 50.7 | 50.7 | 50.7 | 50.7 | 45.5 | 40.5 | 54.2 |
| ER (g/min) | 101 | 83 | 86 | 75 | 128 | 143 | 87 | 79 | 85 | 76 | 69 |
| TC-LonGwin (W/m * K) | 9.327 | 9.621 | 9.707 | 9.708 | 9.374 | 9.104 | 9.161 | 9.905 | 9.536 | 9.072 | 9.353 |
| TC-Hot Disk* (W/m * K) | 11.69 | 12.38 | 12.14 | 12.24 | 11.44 | 11.39 | 11.04 | 11.2 | 10.36 | 10.22 | 10.35 |

Note:

In this Table 2 and Table 3 below:

"SiH/Vi ratio" refers to molar ratio of SiH functionality from the crosslinker to vinyl functionality.

"Wt % Spherical large AlN" refers to wt % of spherical AlN fillers with D50 ≥ 100 μm relative to the total weight of all components in the sample.
"Wt % Small AlN" refers to wt % of AlN fillers with D50 of from 20-80 μm relative to the total weight of all components in the sample.
"ER" and "TC-LonGwin" (also as "TC") were measured according to the test methods described above.

"TC-Hot Disk" refers to thermal conductivity measured by using hot disk, according to ISO 22007-2. The thermal conductivity of cured samples was measured by Hot Disk TPS 2500 S instrument with a 3.189 mm Kapton sensor (model 5465). The cured samples were prepared by curing thermally conductive composition samples at 120° C. for 60 min with dimension of 25 mm × 25 mm × 8 mm.

TABLE 3

Compositions and Characterization of Samples (CE 1-16)

| | CE1 | CE2 | CE3 | CE4 | CE5 | CE6 | CE7 | CE8 | CE9 | CE10 | CE11 | CE12 | CE13 | CE14 | CE15 | CE16 |
|---|---|---|---|---|---|---|---|---|---|---|---|---|---|---|---|---|
| Component | | | | | | | | | | | | | | | | |
| Vinyl polymer A1-1 | 2.208 | 2.458 | | 2.257 | 2.590 | | | | | | | | | | | |
| Vinyl polymer A1-2 | | | 1.90 | | | 1.80 | 1.80 | 1.80 | 1.80 | 1.80 | 1.80 | 1.80 | 1.80 | 1.80 | 1.80 | 1.80 |
| SiH crosslinker A2-1 | 0.490 | 0.540 | | | | | | | | | | | | | | |
| SiH crosslinker A2-2 | 0.02 | 0.02 | 0.04 | 0.029 | 0.04 | 0.04 | 0.04 | 0.04 | 0.04 | 0.04 | 0.04 | 0.04 | 0.04 | 0.04 | 0.04 | 0.04 |
| SiH crosslinker A2-3 | | | 0.60 | 0.648 | 0.71 | 0.50 | 0.50 | 0.50 | 0.50 | 0.50 | 0.50 | 0.50 | 0.50 | 0.50 | 0.50 | 0.50 |
| Treating Agent B-1 | 0.20 | 0.20 | 0.20 | 0.193 | 0.20 | 0.20 | 0.20 | 0.20 | 0.20 | 0.20 | 0.20 | 0.20 | 0.20 | 0.20 | 0.20 | 0.20 |
| Treating Agent B-2 | 1.70 | 1.70 | 1.70 | 1.644 | 1.50 | 1.70 | 1.70 | 1.70 | 1.70 | 1.70 | 1.70 | 1.70 | 1.70 | 1.70 | 1.70 | 1.70 |
| TC Filler C1-1 | 22.00 | 20.60 | 53.20 | 26.499 | 20.60 | | | | | 50.1 | | 12.00 | | | | |
| TC Filler C1-2 | | | | | | | | | | | | | | 36.50 | | |
| TC Filler C1-3 | | | | | | | | | | | 10.00 | | 28.00 | | | |
| TC Filler C1-4 | | | | | | 36.20 | 36.20 | 36.20 | | | | 25.00 | | 10.00 | | |
| TC Filler C1-5 | | | | | | | | | | | 45.00 | | 30.00 | | | 50.70 |
| TC Filler C1-6 | | | | 17.36 | | 14.50 | 14.50 | 14.50 | 14.5 | | | | | | | |
| TC Filler C1-7 | | 25.80 | | | | | | | | | | | | | | |
| TC Filler C1-8 | | | | | | | | | | | | | | | 50.70 | |
| TC Filler C1-9 | 22.50 | | | | | | | | | | | | | | | |
| TC Filler C1-10 | | | | | | | | | 36.2 | | | | | | | |
| TC Filler C1-11 | | | | | 33.20 | | | | | | | | | | | |
| TC Filler C2-1 | 32.70 | | 31.80 | 32.35 | 30.80 | | 30.50 | 30.50 | 30.50 | 29.6 | 26.20 | 44.20 | 23.50 | 34.70 | 30.50 | 30.50 |
| TC Filler C2-2 | | 33.00 | | | | 30.50 | | | | | | | | | | |
| TC Filler C2-3 | | 15.50 | | | | | | | | | | | | | | |
| TC Filler C3-1 | 18.00 | | | 15.861 | | 14.50 | | | 14.50 | 13.9 | 14.50 | 14.50 | 14.20 | 14.50 | 14.50 | 14.50 |
| TC Filler C3-2 | | | 10.50 | | 10.30 | | 14.50 | | | | | | | | | |
| TC Filler C3-3 | | | | | | | | 14.50 | | | | | | | | |
| TC Filler C4-1 | | | | 2.901 | | | | | | 2.1 | | | | | | |
| Catalyst D-1 | 0.06 | 0.06 | 0.06 | 0.058 | 0.06 | 0.06 | 0.06 | 0.06 | 0.06 | 0.06 | 0.06 | 0.06 | 0.06 | 0.06 | 0.06 | 0.06 |
| Inhibitor E-1 | 0.002 | 0.002 | 0.002 | 0.006 | 0.002 | 0.002 | 0.002 | 0.002 | 0.002 | 0.002 | 0.002 | 0.002 | 0.002 | 0.002 | 0.002 | 0.002 |
| Pigment F-1 | 0.12 | 0.12 | | 0.193 | | | | | | | | | | | | |
| Characterization | | | | | | | | | | | | | | | | |
| SiH/Vi Ratio | 0.55 | 0.54 | 0.89 | 0.92 | 0.90 | 0.73 | 0.80 | 0.80 | 0.80 | 0.80 | 0.80 | 0.80 | 0.80 | 0.80 | 0.80 | 0.80 |
| Wt % Filler | 95.2 | 94.9 | 95.5 | 95.0 | 94.9 | 95.7 | 95.7 | 95.7 | 95.7 | 95.7 | 95.7 | 95.7 | 95.7 | 95.7 | 95.7 | 95.7 |
| Vol % Filler | 83.3 | 83.5 | 85.3 | 83.3 | 83.5 | 85.3 | 85.3 | 85.3 | 85.3 | 85.3 | 85.3 | 85.1 | 85.3 | 85.2 | 85.2 | 85.2 |
| Wt % Spherical large AlN | 0 | 0 | 0 | 0 | 0 | 36.2 | 36.2 | 36.2 | 0 | 0 | 45.0 | 25.0 | 28.0 | 10.0 | 0 | 50.7 |
| Wt % Small AlN | 44.5 | 46.4 | 53.2 | 43.9 | 20.6 | 14.5 | 14.5 | 14.5 | 14.5 | 50.1 | 10.0 | 12.0 | 30.0 | 36.5 | 50.7 | 0 |
| Wt % Total AlN | 44.5 | 46.4 | 53.2 | 43.9 | 20.6 | 50.7 | 50.7 | 50.7 | 14.5 | 50.1 | 55.0 | 37.0 | 58.0 | 46.5 | 50.7 | 50.7 |
| ER (g/min) | 73 | 0 | 98 | 52 | 62 | 4 | 23 | 29 | 0 | 111 | 51 | 92 | 25 | 100 | 0 | 51 |
| TC-LonGwin (W/m * K) | 7.279 | NA | 7.745 | 8.574 | 8.019 | 11.393 | 9.935 | 9.499 | NA | 8.284 | 10.4 | 8.162 | 10.739 | 8.386 | NA | 10.477 |
| TC-Hot Disk (W/m * K) | NA | NA | 9.517 | 10.84 | 8.085 | 12.65 | 11.26 | 10.95 | NA | 9.051 | 11.12 | 8.799 | 9.915 | 9.365 | NA | 11.77 |

The invention claimed is:

1. A thermally conductive composition comprising:

(A) a curable silicone composition comprising:

(a1) a vinyldimethylsiloxy-terminated polydimethylpolysiloxane having a viscosity in a range of 30 to 400 milliPascal*seconds, (a2) a silicon-hydride functional crosslinker, and (a3) a hydrosilylation catalyst, where the molar ratio of silicon-hydride functionality from the crosslinker to vinyl functionality is in a range of 0.5:1 to 1:1;

(B) a filler treating agent comprising one or both of an alkyl trialkoxysilane and a mono-trialkoxysiloxy terminated dimethylpolysiloxane; and (C) a thermally conductive filler mixture comprising, based on the weight of the thermally conductive composition, (c1) from 40 weight-percent to 55 weight-percent of aluminum nitride fillers, comprising a blend of:

(c1-a) from 15 weight-percent to 41 weight-percent of spherical aluminum nitride particles having a D50 particle size of 100 micrometers or more, and (c1-b) spherical or irregular shaped aluminum nitride particles having a D50 particle size of from 20 to 80 micrometers;

(c2) spherical aluminum oxide particles having a D50 particle size of from 1 to 5 micrometers; and (c3) from 10 weight-percent to 20 weight-percent of irregular zinc oxide particles having a D50 particle size of from 0.1 to 0.5 micrometer;

where the total amount of the thermally conductive filler mixture is from 94 weight-percent to 97 weight-percent, based on the weight of the thermally conductive composition.

2. The thermally conductive composition of claim 1, wherein the spherical or irregular shaped aluminum nitride particles (c1-b) with a D50 particle size of from 20 to 80 micrometers are present at a concentration of from 10 weight-percent to 39 weight-percent, based on the weight of the thermally conductive composition.

3. The thermally conductive composition of claim 1, wherein spherical aluminum nitride particles in the blend are at a total concentration of greater than 60 weight-percent to 100 weight-percent, based on the total weight of the blend of the aluminum nitride particles (c1-a) and (c1-b).

4. The thermally conductive composition of claim 1, wherein the thermally conductive filler mixture (C) comprises from zero to less than 1 weight-percent of boron nitride fillers, based on the weight of the thermally conductive composition.

5. The thermally conductive composition of claim 1, wherein the spherical aluminum nitride particles (c1-a) have a D50 particle size of 120 micrometers or more.

6. The thermally conductive composition of claim 1, wherein the spherical aluminum nitride particles (c1-a) with a D50 particle size of 100 micrometers or more are present at a concentration of from 30 weight-percent to 38 weight-percent, based on the weight of the thermally conductive composition.

7. The thermally conductive composition of claim 1, wherein the aluminum nitride fillers (c1) are present at a concentration of from 45 weight-percent to 55 weight-percent, based on the weight of the thermally conductive composition.

8. The thermally conductive composition of claim 1, wherein the silicon-hydride functional crosslinker comprises one or more polysiloxane having chemical structures selected from (II), (III) or combinations thereof:

$$H(CH_3)_2SiO—[(CH_3)_2)SiO)]_x—Si(CH_3)_2H \quad (II)$$

$$(CH_3)_3SiO—[(CH_3)HSiO]_y[(CH_3)_2)SiO]_z—Si(CH_3)_3 \quad (III)$$

where subscript x has a value in a range of 10 to 100, subscript y has a value in a range of 3 to 30, and subscript z has a value in a range of 3 to 100.

9. The thermally conductive composition of claim 1, wherein the alkyl trialkoxysilane is selected from $C_6$ to $C_{12}$ alkyl trimethoxysilanes and the mono-trialkoxysiloxy terminated dimethylpolysiloxane has an average chemical structure (IV):

$$(CH_3)_2SiO—[(CH_3)_2SiO]_a—Si(OR')_3 \quad (IV)$$

where subscript a has a value in a range of from 20 to 150 and R' is a $C_1$ to $C_{12}$ alkyl group.

10. An article comprising the thermally conductive composition of claim 1 on another material.

11. The article of claim 10, wherein the thermally conductive composition is between and in thermal contact with a heat generating component of an electronic device and one or more than one of a heat sink, cooling plate and metal cover for the electronic device.

* * * * *